United States Patent [19]
Nadd

[11] Patent Number: 4,792,840
[45] Date of Patent: Dec. 20, 1988

[54] RESISTOR INTEGRATED ON A SEMICONDUCTOR SUBSTRATE

[75] Inventor: Bruno Nadd, Ollieres, France

[73] Assignee: Thomson-CSF, Paris, France

[21] Appl. No.: 32,561

[22] Filed: Apr. 1, 1987

[30] Foreign Application Priority Data

Apr. 4, 1986 [FR] France .................. 86 04858

[51] Int. Cl.$^4$ .............. H01L 27/02; H01L 29/40; H01L 29/06
[52] U.S. Cl. .................. 357/51; 357/20; 357/53
[58] Field of Search .............. 357/20, 51, 53

[56] References Cited

U.S. PATENT DOCUMENTS

| | | | |
|---|---|---|---|
| 3,138,743 | 6/1964 | Kilby | 357/51 |
| 3,629,667 | 12/1971 | Lubart | 357/51 |
| 4,009,483 | 2/1977 | Clark | 357/53 |
| 4,139,833 | 2/1979 | Kirsch | 338/308 |
| 4,157,563 | 6/1979 | Bosselaar | 357/51 |
| 4,181,878 | 6/1980 | Murari et al. | 357/51 |
| 4,212,025 | 7/1980 | Hirasawa et al. | 357/51 |
| 4,270,137 | 5/1981 | Coe | 357/53 |
| 4,423,433 | 12/1983 | Imaizumi et al. | 357/51 |
| 4,567,502 | 1/1986 | Nakagawa et al. | 357/53 |
| 4,691,224 | 9/1987 | Takada | 357/53 |

FOREIGN PATENT DOCUMENTS 1539871 9/1968 France .

OTHER PUBLICATIONS

Electronics, vol. 38, No. 9, May 3, 1965, pp. 48–59, New York, U.S.; R. M. Burger et al.: "A Broader Choice of Components for Silicon Integrated Circuits", p. 49.

Primary Examiner—Andrew J. James
Assistant Examiner—Jerome Jackson, Jr.
Attorney, Agent, or Firm—Oblon, Fisher, Spivak, McClelland, & Maier

[57] ABSTRACT

The invention provides a resistor integrated on a semiconductor substrate and capable of withstanding high voltages. The integrated resistor is formed by a well of the opposite conductivity type relative to that of the substrate and is in the form of a ribbon wound about one of its ends which is connected electrically to a conducting pole. The conducting pole provides the electric connection of the ribbon with the rear face of the substrate and through this substrate.

4 Claims, 2 Drawing Sheets

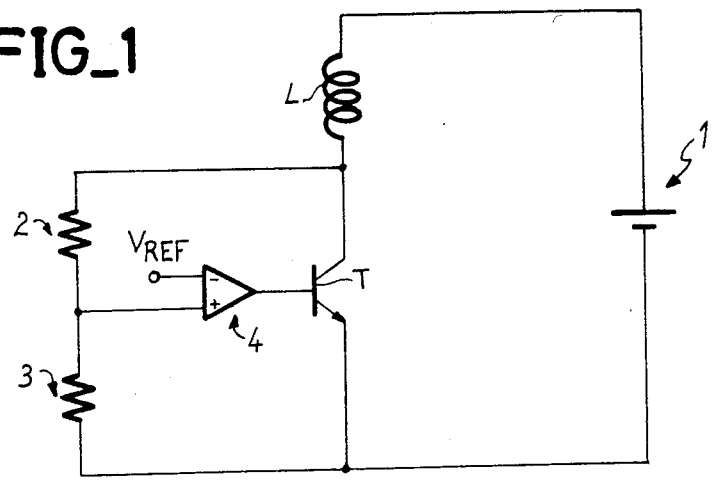
FIG_1
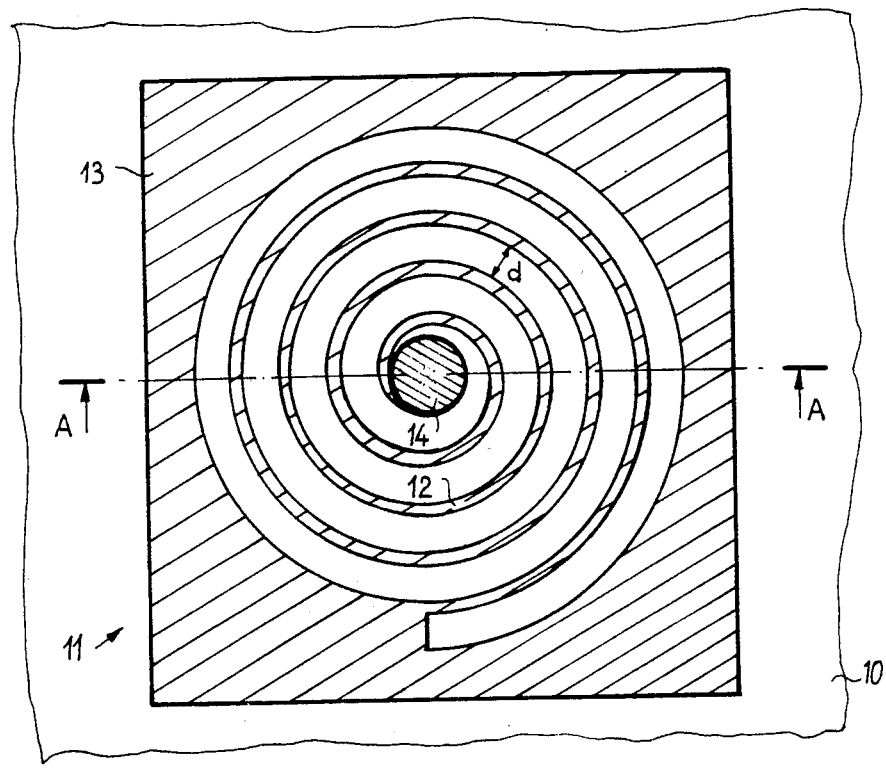
FIG_2

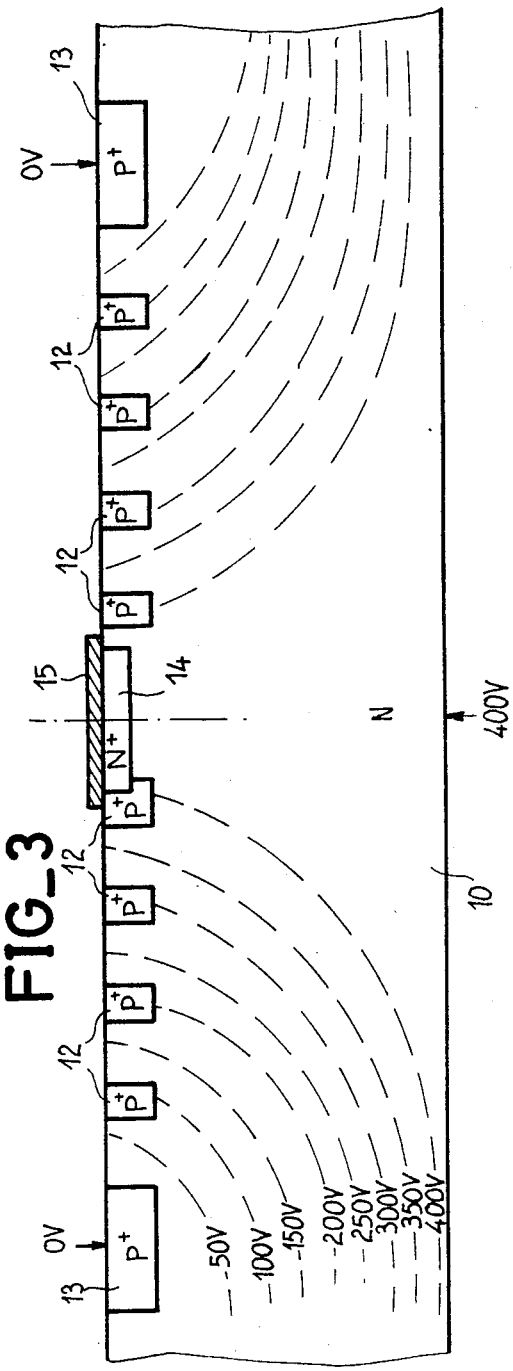
FIG_3
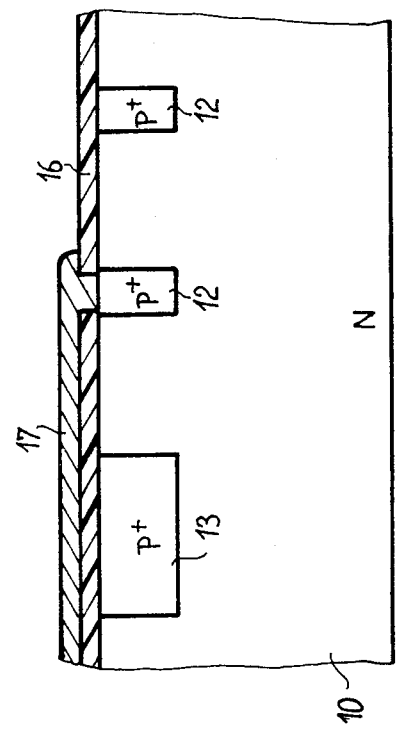
FIG_4

RESISTOR INTEGRATED ON A SEMICONDUCTOR SUBSTRATE

BACKGROUND OF THE INVENTION

1. Field of the invention

The present invention relates to a resistor integrated on a semiconductor substrate and more especially a resistor having one of its ends connected to a point of the substrate subject to a high potential.

In numerous applications concerning semiconductor structures associating a power transistor and its control and/or protection logic, further designated "smart power switches", it is desirable to have resistors connected to the drain or to the collector of the power transistor. If the power transistor is of the VD MOS or bipolar type with vertical conduction, the rear face of the substrate supporting the drain or collector contact is therefore at the potential of this drain or this collector. An electronic ignition circuit for motor vehicles constructed in monolithic form may require a resistance voltage divider bridge withstanding a voltage of the order of 400 V for re-enabling the power transistor in the case of an over voltage. The construction of such a resistor comes up against serious insulating difficulties if it is desired to avoid, in the manufacturing process, certain special steps intended to provide insulation by means of the physical screen.

2. Description of the Prior Art

Generally, different methods are known for integrating a resistor on a semiconductor substrate of given polarity. The natural resistance of an epitaxial layer may be used but this leads to resistance values which are difficult to control and does not allow divider bridges to be formed. This resistor may also be formed by means of a diffused caisson of the opposite opposite conductivity type relative to the substrate. although this solution provides precise control of the value of the resistance, on the other hand it requires the use of special steps for ensuring its physical insulation and these steps are undesirable. Without this physical insulation, such a resistor would, in the case of a device operating at high voltage (for example 400 V), cause breakdown of the junction existing between the substrate and the caisson which is due to the excessive curvature of the equipotentials. In fact, the connection of the resistor thus formed to the rear face of the substrate brought to the potential of the high voltage involves taking the equipotentials up to the front face of the substrate and some of these equipotentials have very small radius of curvature.

In order to overcome these drawbacks, the invention provides an integrated resistance formed by a well of polarity the reverse of that of the substrate, in the form of a ribbon would about one of its ends which is attached to a conducting pole. This conducting pole provides the electrical connection with the rear face of the substrate therethrough. The ribbon serves both as resistor and field distributor rings, which avoids the excessive curvature of the equipotentials.

SUMMARY OF THE INVENTION

The invention has than as object a resistor integrated on a semiconductor substrate of a first conductivity type; the resistor being formed on the first face of the substrate for connection to a voltage available on the second face of the substrate, the resistor being formed by a well of a second conductivity type opposite that of the substrate, wherein the well forming the resistor is in the form of a spiral wound on itself about a conducting pole in the form of highly doped region of the first conductivity type to which one of its ends is connected electrically, the connection with the rear face of the substrate takes place through the thickness of the substrate via the conducting pole.

The spiral well is advantageously extended and surrounded, from its other end, by a part formed by the same well for distributing about the spiral well the potential of a terminal connected to this other end.

BRIEF DESCRIPTION OF THE DRAWINGS

The invention will be better understood and other advantages will be clear from the following description and accompanying Figures in which:

FIG. 1 is an electric diagram of an electronic ignition circuit of the prior art, FIGS. 2 and 3 are respectively top and profile views of a resistor in accordance with the invention, and FIG. 4 is a detail view of a resistor of the invention having an intermediate point.

DESCRIPTION OF THE PREFERRED EMBODIMENTS

An example of the device in which the integration of resistors would be welcome is that of an electronic ignition circuit for motor vehicles. Such a circuit includes an ignition coil in series with a power transistor. This circuit must also include a device for clipping the over voltages. Clipping by means of the Zener diode is difficult to obtain because of the difficulty of integrating this element. Another solution consists of a resistance voltage divider bridge associated with a comparator. This is what is shown in the diagram of FIG. 1. The ignition coil L and the transistor T are disposed in series and connected to the terminals of a battery 1. To the terminals of the transistor T, between emitter and collector, are connected two resistors 2 and 3 connected in series. The common point between these two resistors is connected to one of the inputs of a comparator 4 which receives at its second input the reference voltage VREF. The output of the comparator 4 drives the base of the transistor T. The device formed by the resistors 2 and 3 and by the comparator 4 allows re-enabling of transistor T for clipping the over voltages. Although the battery voltage is relatively low, the divider bridge must be able to withstand high voltages (of the order of 400 V) due to the presence of the ignition coil L. The resistors forming the divider bridge must then be high voltage resistors. Although the comparator involves no problem for its integration, the same cannot be said for the divider bridge for the reasons set forth above.

A resistor of the invention is obtained by diffusion or implantation of a well of conductivity type opposite that of the substrate. This well is formed mainly by a ribbon of reduced width with respect to its length which allows the desired resistance value to be obtained. It is advantageously in the form of a spiral with a large number of turns. The distribution of the equipotentials will depend both on the number of turns and on the distance separating two consecutive turns. In the case of a resistance voltage divider bridge, it is possible to provide an intermediate connection.

The rest of the description will relate to the integration of high voltage resistors in the case of an N type silicon substrate but the invention also applies to other types of substrates.

FIGS. 2 and 3 are respectively top and profile views of a semiconductor substrate supporting a resistor in accordance with the invention. A silicon substrate 10, for example of N+ type having an N type epitaxied layer, is provided. On this substrate there is diffused, by means of a mask of appropriate form, a P+ type well 11 for forming the resistor of the invention. In FIG. 2, only a few turns have been shown for convenience of representation, but the resistor may have many more. The P+ well includes then a spiral part 12 which is preferably extended and surrounded by a part 13 providing electrostatic continuity about the spiral 12. Then an N+ type well 14 may be diffused in the center of the spiral so as to form the conducting pole. Since the integrated resistor is in the form of a spiral, the well 14 will be preferably in the form of a disk so that the equipotentials may be distributed symmetrically. The well 14 provides an electric connection, which is not very resistive, with the rear face of the substrate 10 on which a high voltage will be available.

FIG. 3 is a section through the axis AA of the substrate of FIG. 2. In FIG. 3, a conducting stud 15 circular in shape has been deposited in the center of the sprial and on the well 14 and extends over the end of the spiral. It provides the electric connection between the N+ type well 14 and the P+ type spiral 12. In FIG. 3 the equipotentials have also been shown with broken lines for a voltage of 400 V applied to the rear face of the substrate and for a zero voltage applied to part 13 of the P+ well The spiral serves both as resistor and as field distributing rings. In fact, the potential varies linearly from the outside to the inside of the spiral. In the left hand part of the Figure, equipotentials have been shown which vary by steps of 50 V between 0 and 400 V. Other equipotentials have been shown in the right hand part of the Figure without indicating the value of the voltage to which they correspond. The potential difference between two consecutive turns is then only a fraction of the high voltage and the rise of the equipotentials takes place gradually along the radii of curvature so as to avoid breakdown.

An important element in the design of the spiral is the distance d separating each turn or the last turn of part 13. This distance d must not be greater than a limit distance which may be calculated from the rules of the known art by taking certain parameters into account: maximum admissible voltage, nature and quality of the surface insulation, dimensions of the P+well envisaged, etc. If the distance d is greater than this limit distance, the curvature of the equipotentials will be such that it will cause surface or volume breakdown for a voltage less than the maximum admissible voltage.

Part 13 of the P+ well forms the other end of the resistor and is therefore connected to the desired point. In the example of application shown schematically in FIG. 1, this P+ well is connected to the emitter of the power transistor by means of a metal strand deposited above a dielectric providing the insulation. It is possible to make a connection at any position of the spiral for forming a voltage divider bridge. This is what is shown in FIG. 4, which is an enlargement of a part of FIG. 3. On the front face of substrate 10, in which the resistor of the invention has been diffused, a layer 16 is deposited of a passivation insulator such as silicon oxide SiO2. A contact hole has been etched in layer 16 so as to allow access to a point of the spiral 12. A conducting material layer 17 provides the intermediate contact with the spiral 12.

Without departing from the scope and spirit of the invention, the resistor may be formed by implantation or diffusion operations. It should be noted that its elaboration may benefit from the operations required for forming, on the same substrate, bipolar or VD MOS type transistors as well as other logic circuit elements.

Finally, although the description has related to a resistor in the form of a spiral, other forms of winding may very well be conceived, for example in the form of a Greek key pattern.

What is claimed is

1. A resistor integrated on a semiconductor substrate of a first conductivity type having a first face and a second face and connected between a terminal on the first face and a metallization on the second face, the resistor comprising:
   a first region of a second conductivity type formed into the substrate from said first face, said first region including at least a spiral-shaped portion;
   a second highly doped region of the first conductivity type being formed at the center of the spiral-shaped portion of the first region and contacting the substrate, and
   a conductive stud formed on said first face connecting the second region with an inner portion of the spiral-shaped portion of the first region;
   wherein said terminal comprises an outer portion of the spiral-shaped portion of the first region.

2. The resistor of claim 1, wherein the first region includes a further portion which extends from the outer portion of the spiralshaped portion around said spiral-shaped portion.

3. The resistor of claim 1, wherein said substrate comprises a highly doped wafer covered with an epitaxial layer of the same first conductivity type wherein are formed said first and second regions.

4. The resistor of claim 1, comprising at least one tap contacting an intermediate portion of said spiral shaped portion of the first region.

* * * * *